US012531205B2

(12) United States Patent
Lane et al.

(10) Patent No.: US 12,531,205 B2
(45) Date of Patent: Jan. 20, 2026

(54) EQUIPMENT AND METHOD FOR IMPROVED EDGE UNIFORMITY OF PLASMA PROCESSING OF WAFERS

(71) Applicant: Tokyo Electron Limited, Tokyo (JP)

(72) Inventors: Barton Lane, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 121 days.

(21) Appl. No.: 17/836,792

(22) Filed: Jun. 9, 2022

(65) Prior Publication Data

US 2023/0402255 A1 Dec. 14, 2023

(51) Int. Cl.
*H01J 37/32* (2006.01)

(52) U.S. Cl.
CPC ...... *H01J 37/321* (2013.01); *H01J 37/32091* (2013.01); *H01J 37/3244* (2013.01); *H01J 37/32532* (2013.01); *H01J 2237/06375* (2013.01); *H01J 2237/2007* (2013.01)

(58) Field of Classification Search
USPC .................... 156/345.48; 118/723 I, 723 AN
See application file for complete search history.

(56) References Cited

U.S. PATENT DOCUMENTS 5,529,657 A 6/1996 Ishii
5,942,039 A 8/1999 Kholodenko et al.
6,232,236 B1 5/2001 Shan et al.
2004/0023513 A1* 2/2004 Aoyama ........... H01J 37/32321 257/E21.267
2005/0116788 A1 6/2005 Matters-Kammerer et al.
2006/0151116 A1 7/2006 Wu
2007/0215279 A1 9/2007 Koshiishi
2008/0223873 A1 9/2008 Chen
2009/0056629 A1* 3/2009 Katz ................. H01L 21/32137 118/723 R
2010/0243606 A1 9/2010 Koshimizu
2010/0243620 A1 9/2010 Yamawaku
2013/0087285 A1* 4/2013 Kofuji ............... H01J 37/32192 156/345.33
2015/0015140 A1 1/2015 Denning et al.
2015/0243488 A1 8/2015 Kubota et al.
2016/0322242 A1 11/2016 Nguyen
(Continued)

FOREIGN PATENT DOCUMENTS

EP 1459444 B1 5/2008
JP 2015018796 A 1/2015
KR 20190056021 A 5/2019

OTHER PUBLICATIONS

International Search Report and Written Opinion, International Application No. PCT/US2023/024838, Oct. 4, 2023, 10 pages.
(Continued)

*Primary Examiner* — Ram N Kackar
(74) *Attorney, Agent, or Firm* — Slater Matsil LLP

(57) ABSTRACT

What is described is an equipment for plasma processing including: a pedestal configured to hold a wafer; concentric with the pedestal, a focus ring including an insulator, the focus ring being positioned close to an edge region of the wafer when the wafer is held on the pedestal; and a plurality of gas discharge devices embedded in the focus ring, where each gas discharge device is configured to generate a gas discharge plasma confined within the focus ring.

32 Claims, 4 Drawing Sheets

(56) References Cited

U.S. PATENT DOCUMENTS

| | | | | |
|---|---|---|---|---|
| 2016/0351404 | A1 | 12/2016 | Aramaki et al. | |
| 2017/0018411 | A1 | 1/2017 | Sriraman | |
| 2017/0186587 | A1* | 6/2017 | Kawanabe .......... | H01J 37/3244 |
| 2017/0301578 | A1 | 10/2017 | Hong | |
| 2018/0092196 | A1* | 3/2018 | Notomi ............. | H01J 37/32174 |
| 2018/0350566 | A1 | 12/2018 | Tobe | |
| 2019/0006156 | A1 | 1/2019 | Seo | |
| 2019/0145001 | A1 | 5/2019 | Park | |
| 2019/0206703 | A1* | 7/2019 | Zhao ................. | H01J 37/32174 |
| 2019/0228952 | A1 | 7/2019 | Dorf | |
| 2019/0287758 | A1 | 9/2019 | Pan et al. | |
| 2020/0058469 | A1 | 2/2020 | Ranjan et al. | |
| 2021/0249233 | A1 | 8/2021 | Kajifusa | |
| 2022/0084789 | A1 | 3/2022 | Takeuchi | |

OTHER PUBLICATIONS

International Search Report and Written Opinion, International Application No. PCT/US2023/020619, Aug. 23, 2023, 11 pages.

Babaeva, Natalia Y. et al., “Penetration of plasma into the wafer-focus ring gap in capacitively coupled plasmas,” Journal of Applied Physics 101, 113307, Jun. 8, 2007, 11 pages.

Panagopoulos, Theodoros et al., “Three-dimensional simulation of an inductively coupled plasma reactor,” Journal of Applied Physics, vol. 91, No. 5, Mar. 1, 2002, 10 pages.

Yang, Kyung Chae et al., “Effect of Structure and Material Variation of Focus Ring for Enhanced Etch Resistance,” Nanoscience and Nanotechnology Letters, vol. 9, 24-29, Jan. 2017, 6 pages.

* cited by examiner

EQUIPMENT AND METHOD FOR IMPROVED EDGE UNIFORMITY OF PLASMA PROCESSING OF WAFERS

TECHNICAL FIELD

The present invention relates generally to systems and methods for plasma processing, and, in particular embodiments, to equipment and methods for improved uniformity of plasma processing across an edge region of wafers.

BACKGROUND

An integrated circuit (IC) is a network of electronic components in a monolithic structure comprising a stack of patterned layers in a semiconductor wafer. A matrix of IC units is formed on each wafer by processing wafers through a series of patterning levels. At each level, a deposited layer for the IC's components is patterned by a step-and-repeat lithography technique that prints identical copies of a radiation pattern on a wafer coated with photoresist. The pattern is transferred to a layer below by a masked etch process to form the patterned component layer. Sacrificial masking layers are etched off and the sequence of deposition and patterning is repeated for the next level.

Many of the deposition and etch steps in IC fabrication involve plasma processes, where energetic ions and radicals from a gas discharge modify the wafer surface physically and chemically. The fluxes of ions and radicals toward the wafer are influenced by the electrical and chemical properties of the surface material. Generally, it is more difficult to maintain uniform ambiance across an edge region of the wafer because the surface material inevitably changes abruptly at the wafer's edge. A material discontinuity leads to discontinuities in properties such as electrical impedance and chemical reactivity that alter the ion and radical fluxes near the edge. This results in locally non-uniform plasma processing which, in turn, may result in increased yield loss of functional IC units in the edge region. Therefore, further innovation to improve edge uniformity in plasma processing is desirable.

SUMMARY

An equipment for plasma processing including: a pedestal configured to hold a wafer; concentric with the pedestal, a focus ring including an insulator, the focus ring being positioned close to an edge region of the wafer when the wafer is held on the pedestal; and a plurality of gas discharge devices embedded in the focus ring, where each gas discharge device is configured to generate a gas discharge plasma confined within the focus ring.

A plasma processing system, the system including: a plasma process chamber; a pedestal configured to hold a wafer inside the chamber; a first radio frequency (RF) power supply coupled to a first RF electrode, the first RF electrode being configured to generate direct plasma over the pedestal using RF source power from the first RF power supply; located in the chamber, a radical distribution plenum having a plurality of exit holes arranged circularly around an edge of the wafer when the wafer is held on the pedestal, where the plenum is configured to receive a flow of radicals and distribute the flow out to the chamber through the plurality of exit holes; and a radical source coupled to the plenum, the radical source being configured to flow radicals into the plenum and, where the radical source is different from the direct plasma.

A method of plasma processing including: from a primary radical source, generating a main flow of radicals directed toward a major surface of a wafer disposed on a pedestal inside a plasma process chamber; from a secondary radical source, generating a supplemental flow of radicals directed toward an edge region of the major surface, the generating the supplemental flow of radicals including flowing radicals through a plurality of exit holes of an annular radical distribution plenum disposed in the chamber around an edge of the wafer; and exposing the major surface to a combined flow of radicals, the combined flow being a combination of the main flow and the supplemental flow.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
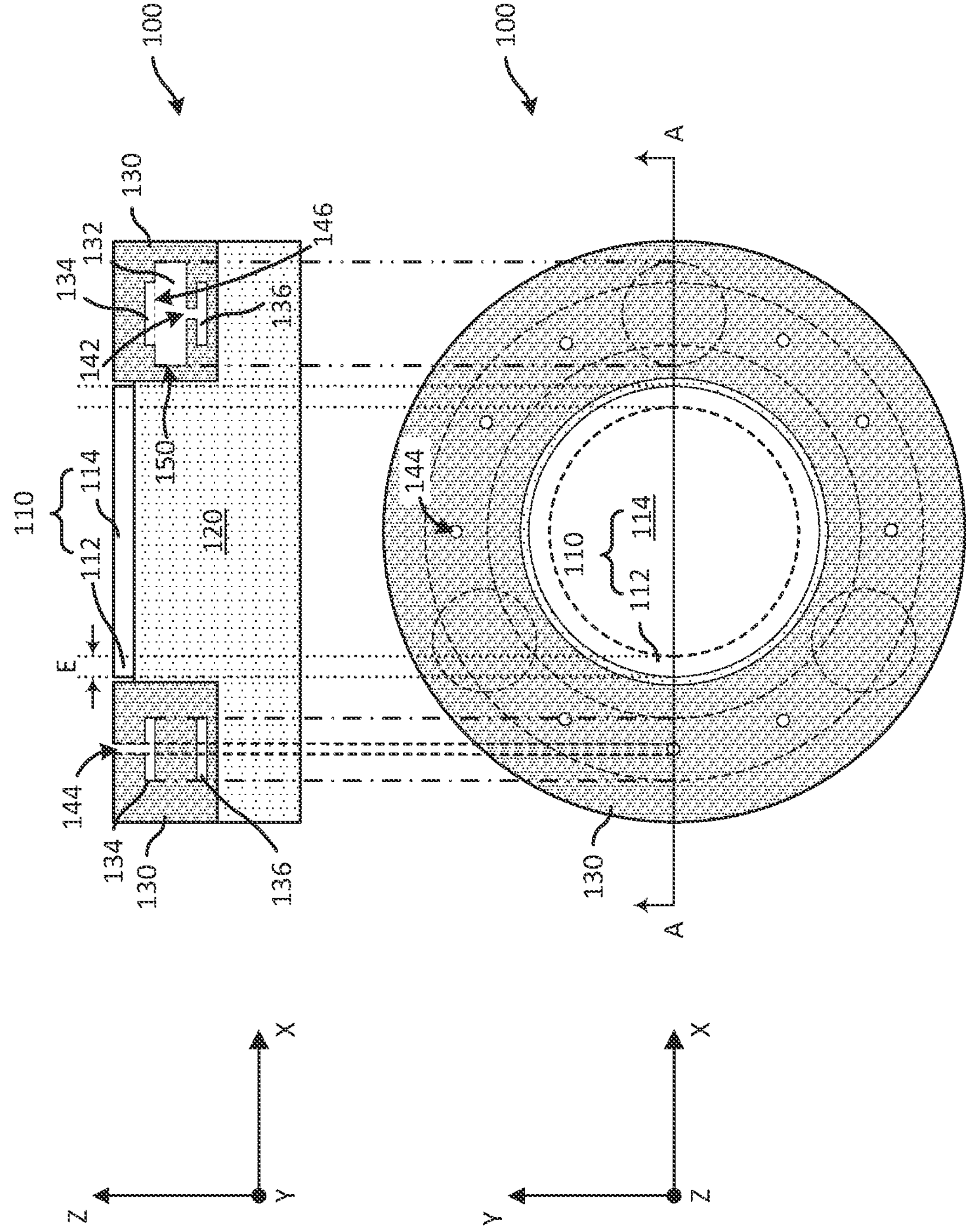
FIG. 1 illustrates a cross-sectional view and a planar view of an equipment for plasma processing, in accordance with some embodiment.

The plasma processing equipment and method, described in this disclosure, provide an advantage of improved process uniformity across an edge region of a semiconductor wafer when processed through a plasma processing step in accordance with various embodiments of the invention. Embodiments discussed in this application achieve these and other improvements by generating a supplemental flow of radicals directed toward an edge region of the wafer in a plasma process chamber where the wafer is being processed.

In the embodiments described in this disclosure, radicals for the supplemental flow are introduced through a circular arrangement of exit holes of an annular plenum located inside the chamber and positioned around the wafer near its edge. After exiting the plenum, a portion of the radicals flow toward the wafer and, in the edge region of the wafer, the supplemental flow mixes with a main flow of radicals directed toward a top surface of the wafer. A combination of these two independent flows contributes to the radicals that interact chemically with the surface of the edge region. The extent of the region over which the supplemental flow perceptibly influences a radical flux to the surface may be limited to, roughly, the edge region of the wafer by constraining the strength of the supplemental flow relative to that of the main flow. Thus, generating the supplemental flow, in addition to the main flow provides a mechanism for adjusting a supply of radicals to the surface over the edge region of the wafer independent of the radical supply to the surface over the central region of the wafer.

Conventional plasma processing equipment and methods do not include an additional independent source of radicals to modify a supply of radicals to the surface over the edge region of the wafer provided by the main flow. The main flow of radicals may establish a roughly uniform flux of radicals to the surface in a central region of the wafer. However, because of a discontinuity in the surface material across the edge of the wafer, the main radical flow is unable to extend the uniformity all the way to the edge of the wafer. The radical flux may deviate from the uniform central value, with the deviation becoming more prominent closer to the edge. As mentioned in the background section, discontinuities in electrical and chemical properties due to the material discontinuity across the edge may result in radial nonuniformities in the densities and energy distributions of radicals (as well as of ions and free electrons) in the edge region of the wafer.

Generally, in absence of any other flow of radicals, the main flow establishes a radial distribution of radical flux to the surface that is roughly uniform in the central region and decreases with increasing radial distance from the center in the edge region of the wafer. The resulting edge non-uniformity of the plasma process has been reduced in the embodiments of plasma processing systems described in this disclosure with two independent (i.e., different) sources for radicals: a primary radical source for the main flow and a secondary radical source for the supplemental flow. Having a distinct set of process parameters that selectively modifies the radical supply to the edge region gives the additional degrees of freedom in adjusting the radical distribution over the entire surface for more uniform plasma processing from center to edge. Furthermore, as explained in detail below in this disclosure, the supplemental flow adds a negligible number of ions to the ambiance to which the wafer is exposed; thus, providing an advantage of adjusting the radical flux to the edge region of the wafer being processed independent of the ion flux.

An example plasma processing equipment configured to provide a supplemental flow of radicals is described with reference to FIG. 1, and an example plasma processing system including equipment to generate the supplemental radicals is described with reference to FIG. 2. An example gas discharge device that may be used for a secondary radical source is described with reference to FIG. 1 and FIG. 3. A flow diagram illustrated in FIG. 4 is used to explain an example method for improving uniformity of plasma processing across a wafer by adding a supplemental flow of radicals over a main flow.

FIG. 1 illustrates a cross-sectional view and a top planar view of an example plasma processing equipment 100 comprising a pedestal 120 and a focus ring 130. The pedestal 120 is configured to hold a semiconductor wafer inside a chamber of a single-wafer tool used to process a major surface of the wafer. For example, pedestal 120 may be an electrostatic chuck of plasma processing equipment 100. In FIG. 1, a wafer no has been loaded on the pedestal 120. The pedestal (e.g., pedestal 120) in a plasma process chamber often comprises a conductor that is used as an electrode that may be coupled to a radio frequency (RF) power supply, a DC bias potential, or a reference potential (commonly referred to as ground). The focus ring 130 comprising insulating material is disposed around the pedestal 120.

Generally, plasma equipment using direct plasma to process a wafer held on a pedestal comprising conductive material includes an insulating or doped semiconductor focus ring to improve process uniformity across the wafer for a plasma process. The conventional focus ring is a ring-shaped insulator or doped semiconductor installed concentric with the pedestal and positioned on/around the pedestal close to the wafer edge. However, a conductive material such as a doped semiconductor may be unsuitable for the focus rings in the embodiments described in this disclosure, for example, for focus ring 130 in FIG. 1. This is because, as explained in further detail below, in some embodiments, an RF resonant structure comprising conductive parts is embedded in the focus ring (e.g., focus ring 130). A purpose for installing the focus ring is to alter the electromagnetic fields and chemical activity in and around the edge region of the wafer to perturb ion and radical distributions in a way that results in a more uniform deposition rate (or etch rate) for the plasma deposition (or etch) process. The material and geometric parameters for a focus ring design may be selected to reduce the effects of the discontinuities at the edge of the wafer. The discontinuities include not only the discontinuities in physical and chemical properties (e.g., discontinuity in dielectric constant and reaction rate) but also a geometrical discontinuity. For example, without the ring the plasma sheath may undesirably wrap around the sides of the wafer.

As known to persons skilled in the art, focus rings of various shapes and materials may be used. The structure may comprise a solid insulator, doped semiconductor or partially hollow blocks. The composition of the focus ring material may comprise a single material, a core coated with a different material, or segments of multiple materials. Dielectric materials used for focus rings may include undoped silicon, quartz, amorphous silicon oxide, alumina, zirconia, yttria, and polytetrafluoroethylene (PTFE). Doped semiconductor materials include doped silicon (although it is not used in the focus rings in the embodiments described in this disclosure).

The focus ring around a pedestal designed to hold a 300 mm (diameter) wafer may have an inner diameter of about 290 mm to about 350 mm, an outer diameter of about 350 mm to about 500 mm and a thickness of about 2 mm to about 10 mm. An inner diameter less than the wafer diameter implies that a portion of the focus ring is a support ring below the wafer while the remaining portion is thicker and extends above the pedestal around the wafer edge. The upper surface of the focus ring may be located from being roughly 3 mm below the top surface of the wafer to about 6 mm above the wafer surface. Typically, a lateral gap of about 1 mm to 5 mm is allowed between the wafer and the focus ring.

In the example embodiment illustrated in FIG. 1, the focus ring 130 has been configured to provide the supplemental flow of radicals mentioned above. A plurality of gas discharge devices 150 has been embedded in the focus ring 130 of equipment 100. One of the plurality of gas discharge devices 150 is illustrated in a cross-sectional view (the X-Z plane) of the equipment 100. In the top planar view (the X-Y plane) in FIG. 1, three embedded gas discharge devices 150, indicated by three dashed circles, are shown for illustrative purposes only. In various embodiments, the number of gas discharge devices 150 may vary from about six to about 24.

Each gas discharge device 150 comprises a cavity 132. In the example equipment 100, each cavity 132 is shaped like a vertically oriented cylinder. In various embodiments, the cavity of the gas discharge device may have various shapes. For example, the cavity may be shaped like a prism with an oval base or a polygonal base, such as a rectangular or hexagonal base.

In addition to the cavity 132, each embedded gas discharge device 150 comprises an RF resonant structure configured to generate a gas discharge plasma confined within the cavity 132. The RF resonant structure is described in detail further below with reference to FIG. 3.

A gaseous mixture comprising a source gas for supplemental radicals and diluent gases may be introduced into the cavity 132 through a gas inlet 142 from a gas distribution channel 136. The gas inlet 142 (located in the floor of the cylindrical cavity 132 in FIG. 1) couples the cavity 132 to the gas distribution channel 136. The incoming gas may be ionized in the cavity 132 by the RF resonant structure, when coupled to an RF power supply tuned to the resonant frequency, thereby igniting a gas discharge. The gas discharge plasma is confined inside the cavity 132 and sustained using RF source power supplied at the resonant frequency. Energetic particles, including radicals, generated in the discharge may exit the cavity 132 in a gas flow through an outlet, such as a radical outlet 146 in the ceiling of the cylindrical cavity 132 in FIG. 1. The radical outlet 146 couples the cavity 132 to a radical distribution plenum 134.

As illustrated in FIG. 1, the gas distribution channel 136 and the radical distribution plenum 134 are annular shaped spaces embedded in the insulating focus ring 130. The gas distribution channel 136 is disposed in a lower portion of the focus ring 130 below the cavity 132, while the radical distribution channel 134 is disposed in an upper portion of the focus ring 130 above the cavity 132, as illustrated in the cross-sectional view in FIG. 1. In some embodiments, the annular plenum (e.g., plenum 134) inside the upper portion of the insulating ring, such as the insulating focus ring 130, comprises a plurality of plenum segments distributed azimuthally in the ring. Each plenum segment may be coupled to two adjacent cavities 132 disposed on two opposite sides of the segment.

In this example, the gas distribution channel 136 and the radical distribution plenum 134 are shown to be of equal width; hence, in the planar view (the X-Y plane) they are indicated by coincident dashed rings. In some other embodiment, the gas distribution channel 136 and the radical distribution plenum 134 may have different widths.

The gas distribution channel 136 is configured to receive gas through a gas entrance (not shown) coupled to an external supplemental gas supply system and distribute the gas to the plurality of gas discharge devices 150. The radical distribution plenum 134 receives an influx of radicals through the radical outlets 146 and distributes the radical flow to a plurality of exit holes 144 of the plenum 134. The cross-sectional view in FIG. 1 illustrates one such exit hole 144, and the planar view in FIG. 1 shows the plurality of exit holes 144 distributed azimuthally around the wafer no. The exit holes 144 are spaced from the radical outlets 146 by distances on the order of a centimeter. Hence, any energetic ion that may exit through the radical outlet 146 is likely to collide with the walls of the plenum 134. As a result of these collisions, the ions, typically, lose energy and get neutralized by recombining with electrons in the walls of the plenum. Only a negligible number of ions may reach the exit holes 144.

In the example embodiment illustrated in FIG. 1, there are three exit holes 144 of the plenum 134 shown in each arc segment between consecutive cavities 132. In another embodiment, there may be a different number of exit holes 144. In various embodiments, exit orifices of various shapes may be used. For example, a group of circular holes may be replaced with a narrow slit.

When the plasma processing equipment 100 is operated, a plume of supplemental radicals may be emitted from each exit hole 144 of the circular arrangement of exit holes 144 around the wafer 110. After exiting through the exit holes 144 of the plenum 134, a portion of the radicals may flow toward an annular edge region 112 of the wafer no and merge with the main flow of radicals that is present over the entire wafer 110, including a central region 114. A boundary between the ring-shaped edge region 112 and the circular central region 114 has been indicated by a dashed circle on the surface of the wafer no extending from the center to a distance, E, from the edge. The distance, E, of the boundary from the edge is loosely defined to indicate a width of a region near the edge where, using only a primary radical source, the achieved process uniformity may be significantly worse relative to the uniformity achieved close to the center of the wafer. Without the supplemental radical flow, the process nonuniformity in the edge region 112 may exceed a tolerance limit resulting in excessive yield loss in the edge region 112. The dimension, E, of the edge region may depend on many factors such as the plasma process, chamber design, RF electrode design, RF waveform, and the surface material of the wafer being processed. Generally, for a 300 mm diameter wafer, E does not exceed 20 mm and, in some instances, E may be below 100 mm, for example 5 mm. Despite a small width of 5 mm to 100 mm, the edge region may be having about 1% to about 3% of the IC units printed on a 300 mm wafer. A yield loss of 1% is significant in high volume manufacturing. The supplemental radical flow originating from the exit holes 144 toward the edge region 112 provides an advantage of mitigating the yield loss due to nonuniform processing in the edge region 112.

Next, a plasma processing system is described that includes equipment (e.g., the example equipment 100) configured to provide a supplemental flow of radicals.

Figure 2:
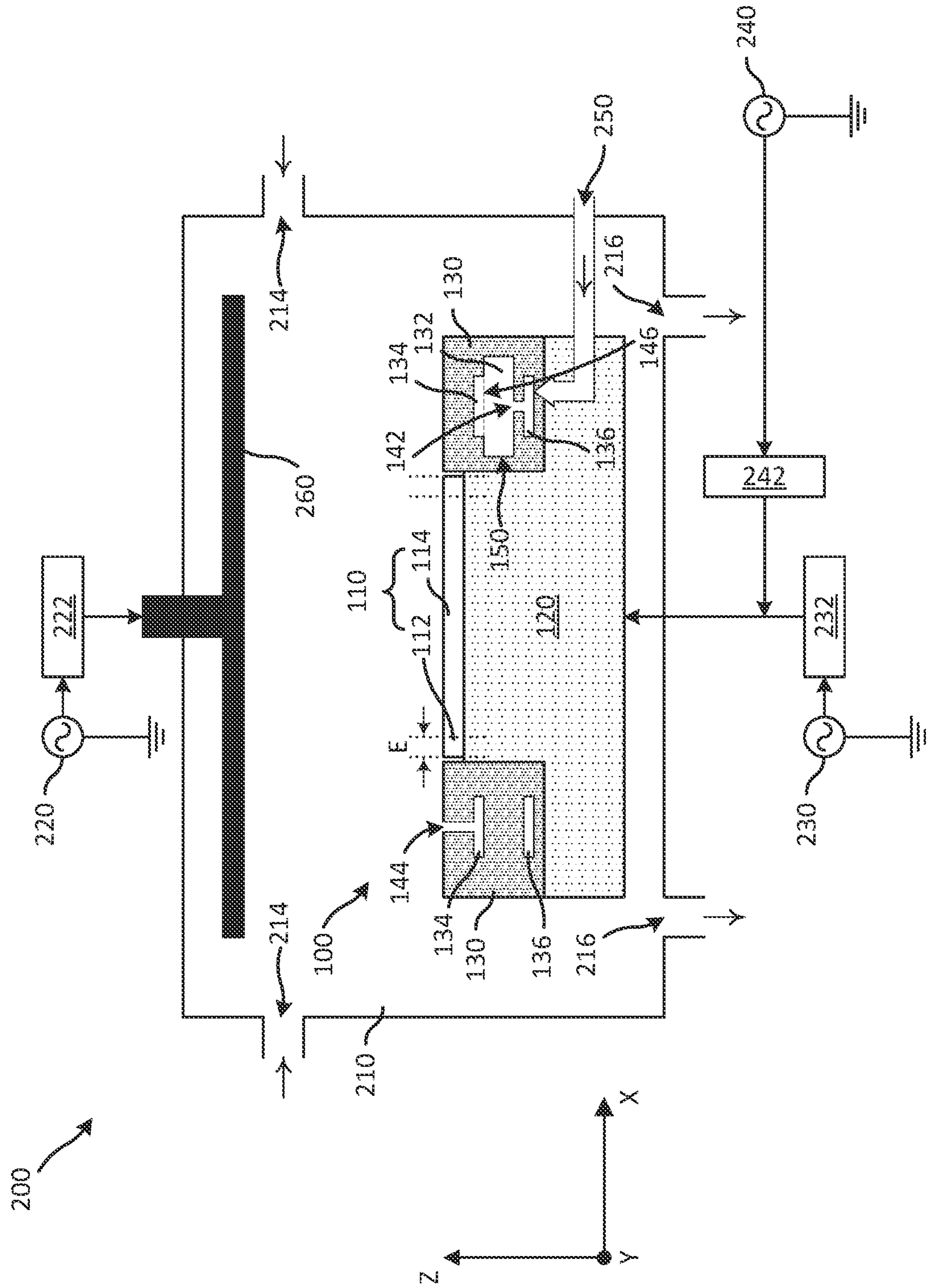
FIG. 2 illustrates a schematic view of a plasma processing system, in accordance with some embodiment.

FIG. 2 illustrates a schematic of an example plasma processing system 200 using the example equipment 100 (described above with reference to FIG. 1). As illustrated in FIG. 2, the plasma processing system 200 comprises a plasma process chamber 210 coupled to a main gas flow system configured to flow gas through the chamber 210. The main gas flow system may comprise gas canisters, piping, valves, vacuum pumps, sensors, and controllers to supply a gaseous mixture comprising process gases and diluents to the chamber 210 through gas inlets 214, remove gaseous byproducts through exhausts 216, and maintain a desired gas pressure in the plasma process chamber 210.

The example equipment 100, comprising the pedestal 120 and the focus ring 130, is shown holding the wafer no in the chamber 210 for processing. As mentioned above, the gas distribution channel 136 is configured to receive gas supplied by a supplemental gas supply system. FIG. 2 shows a supplemental gas pipe 250, indicated schematically by a bent block arrow, having one end (indicated by the arrowhead) coupled to the gas entrance (not shown) of the gas distribution channel 136. The other end of the supplemental gas pipe 250 may be coupled to the supplemental gas supply system.

A plasma processing system further comprises electrodes and electrical power supplies coupled to the electrodes and ground. As known to persons skilled in the art, an RF power supply supplying RF power to a load impedance is, generally, coupled to an electrode of the load via an impedance matching network disposed close to the electrode. The matching network is used to suppress reflections and achieve optimum power transfer.

The example plasma processing system 200, illustrated in FIG. 2, is configured to generate direct plasma over the wafer no held on the pedestal 120 in chamber 210. In this embodiment, the direct plasma would be the primary radical source for the main radical flow (in addition to being a source for a flow of ions) used to process the wafer no. A first RF power supply 220, shown schematically in FIG. 2, is coupled to a first RF electrode, for example, the disc-shaped first RF electrode 260 in the embodiment illustrated in FIG.

2. The first RF electrode 260 is configured to generate direct plasma over the pedestal 120 using RF source power from the first RF power supply 220 coupled via a first matching network 222. In FIG. 2, the chamber 210 is configured as a capacitively coupled plasma (CCP) reactor using a disc-shaped first RF electrode 260. In some other embodiment, the chamber 210 may be configured as an inductively coupled plasma (ICP) reactor receiving source power from a first RF electrode shaped like a planar coil or a helical resonator. Generally, the helical resonator is a helical coil wound around a cylindrical insulating sidewall of the chamber 210. The planar coil may be placed over a top cover of the chamber 210, where the top cover comprises an insulating window, for example, a quartz window.

In some embodiments, a second RF power supply 230 may be coupled to a second RF electrode, where the second RF electrode is configured to provide RF bias power to the plasma from the second RF power supply. In the example plasma processing system 200, a conductive part of the pedestal 120 is being used as the second RF electrode receiving bias power via a respective second matching network 232.

The schematic illustrated in FIG. 2 shows that the secondary radical source used by the plasma processing system 200 is the plurality of gas discharge devices 150, embedded in the insulating focus ring 130, as described above with reference to FIG. 1. As mentioned above, each gas discharge device 150 comprises the cavity 132 and the RF resonant structure comprising conductive parts that are described in detail further below with reference to FIG. 3.

A gas discharge may be generated in each cavity 132 using RF source power supplied to the RF resonant structure at its resonant frequency to initiate oscillating electromagnetic fields that attain a high enough magnitude to ignite and sustain plasma in the cavity 132. The RF source power is provided by coupling the resonant structure to a third RF power supply 240 via a third matching network 242. As illustrated in FIG. 2, the RF signal is routed from an output of the third matching network 242 to the pedestal 120. In this embodiment, the RF signal at the pedestal 120 gets capacitively coupled to a conductive plate of the RF resonators of the plurality of gas discharge devices 150. The conductive plate of the RF resonators and the conductive part of the pedestal 120 are the two plates of the coupling capacitor, and the capacitor dielectric between the two capacitor plates is the insulating material of the focus ring 130. The coupling capacitor structure is described further with reference to FIG. 3.

While in the example plasma processing system 200, RF source power is provided to the RF resonators of the gas discharge devices by capacitive coupling, in some other embodiments the coupling may be an inductive coupling, or a direct connection (or resistive coupling), or a combination of inductive and capacitive coupling.

In an embodiment where the second RF power supply 230 is also coupled to the pedestal 120 via the matching network 232 (e.g., the embodiment illustrated in FIG. 2), the RF bias signal from the second RF power supply 230 and the RF source signal from the third RF power supply 240 are superposed on each other at the conductive part of the pedestal 120. The superposed signal may be used to provide RF source power to the resonant structures of the gas discharge devices 150. Generally, RF bias signals used in plasma processing, such as the signal from the second RF power supply 230, have a lower frequency relative to the RF source signals, such as the signals from the first RF power supply 220 and the third RF power supply 240. Accordingly, if the second RF power supply 230 generates the RF bias signal at a first frequency and the third RF power supply 240 generates the RF source signal at a second frequency then the first frequency may be less than the second frequency.

In the example plasma processing system 200, the secondary source of radicals is a plurality of gas discharge devices embedded in an insulating ring installed in a plasma process chamber, such as the devices 150 embedded in the focus ring 130, described above with reference to FIG. 1. Gas discharge plasma confined in cavities 132 of the devices 150 provide the supplemental radicals to an annular radical distribution plenum 134. The plenum 134 receives the influx of radicals and distributes the flow to exit holes 144, which deliver an efflux of supplemental radicals to the plasma process chamber. By confining the gas discharges in cavities 132 inside the focus ring 130 and spacing the cavities 132 from the plenum exit holes 144 provide the advantage of adjusting the radical flux to the surface over the edge region 112 of the wafer 110 without altering the ion flux there.

In some other embodiment, the secondary source of radicals may be a remote plasma source, where the gas discharge plasma for supplemental radicals is generated at a location outside the plasma process chamber in which the wafer is processed. One advantage of using a remote plasma source as the secondary source is that the dimensions of the space in which the gas discharge plasma for generating the supplemental radicals is confined is less restrictive than the cavity (e.g., cavity 132) of each of the plurality of gas discharge devices (e.g., the gas discharge devices 150) embedded in an insulating ring (e.g., the insulating focus ring 130). Generally, igniting and sustaining a gas discharge may be achieved more reliably if dimensional constraints on the space available for confining the discharge are relaxed. The radical distribution plenum and exit holes may be housed in an insulating ring (e.g., the insulating focus ring 130), similar to the plenum 134 and exit holes 144 (see FIGS. 1 and 2). In this embodiment, the radical distribution plenum receives supplemental radicals from the remote plasma source. In contrast, in the example plasma processing system 200, the supplemental radicals are supplied to the plenum 134 by the plurality of gas discharge devices 150 embedded in the focus ring 130. When the secondary source of the plasma processing system is remote from the plasma chamber where the wafer is held (e.g., a remote plasma source), the plurality of gas discharge devices 150 as well as the gas distribution channel 136 and associated supplemental gas supply are not needed and may be removed.

As described above, the primary source of radicals in the example plasma processing system 200 is the direct plasma generated in the plasma process chamber 210. The direct plasma is sustained over the pedestal 120 with the wafer no exposed to the flux of various particles (e.g., ions and radicals) from the plasma. In some other embodiment, the primary source of radicals may be a remote plasma source instead of direct plasma. Accordingly, for this embodiment, the plasma process chamber has to be configured as a remote plasma process chamber.

In the embodiments of plasma processing systems described above, including the example plasma processing system 200, the wafer (e.g., wafer no) is exposed to a combination of a main flow of radicals directed toward a top surface of the wafer and a supplemental radical flow toward the edge region of the wafer. The combined flow of radicals chemically modifies the wafer surface over the edge region. As explained above, the supplemental radical flow in the plasma process chamber originates from the efflux of supplemental radicals from exit holes (e.g., exit holes 144)

of an annular plenum (e.g., plenum 134) housed in a focus ring (e.g., the focus ring 130) positioned around the wafer no in the chamber. In another embodiment, an insulating ring other than the focus ring may be used to house the radical distribution plenum. In an embodiment, the insulating ring other than the focus ring may be disposed at the walls of the plasma chamber 210. Having an insulating ring exclusively for introducing the supplemental radicals to the plasma process chamber provides greater flexibility in optimizing the design of the ring and the components embedded in the ring.

Figure 3:
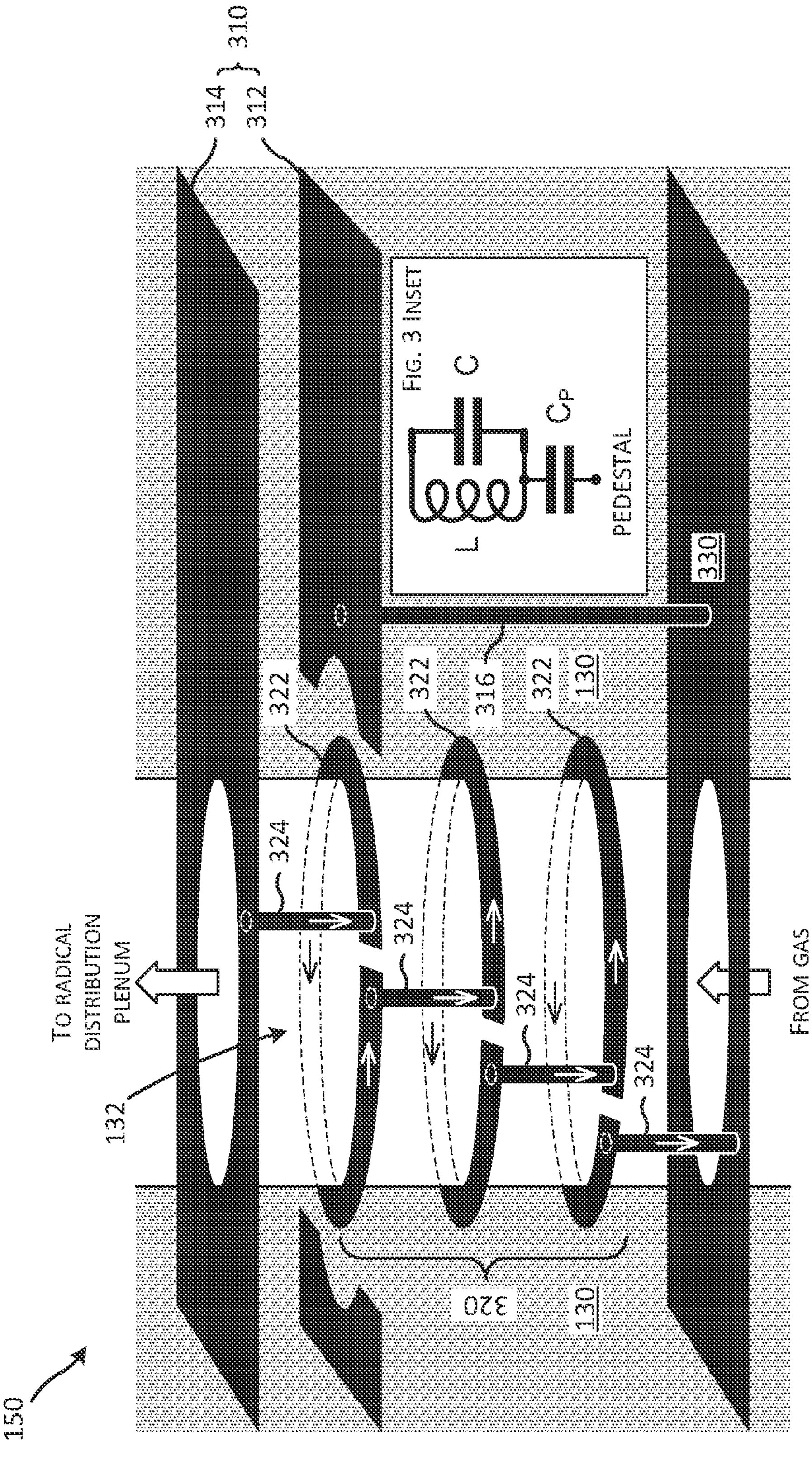
FIG. 3 illustrates a perspective view of an embedded gas discharge device and a circuit representation of a radio frequency (RF) resonant structure of the embedded gas discharge device, in accordance with some embodiment.
Figure 4:
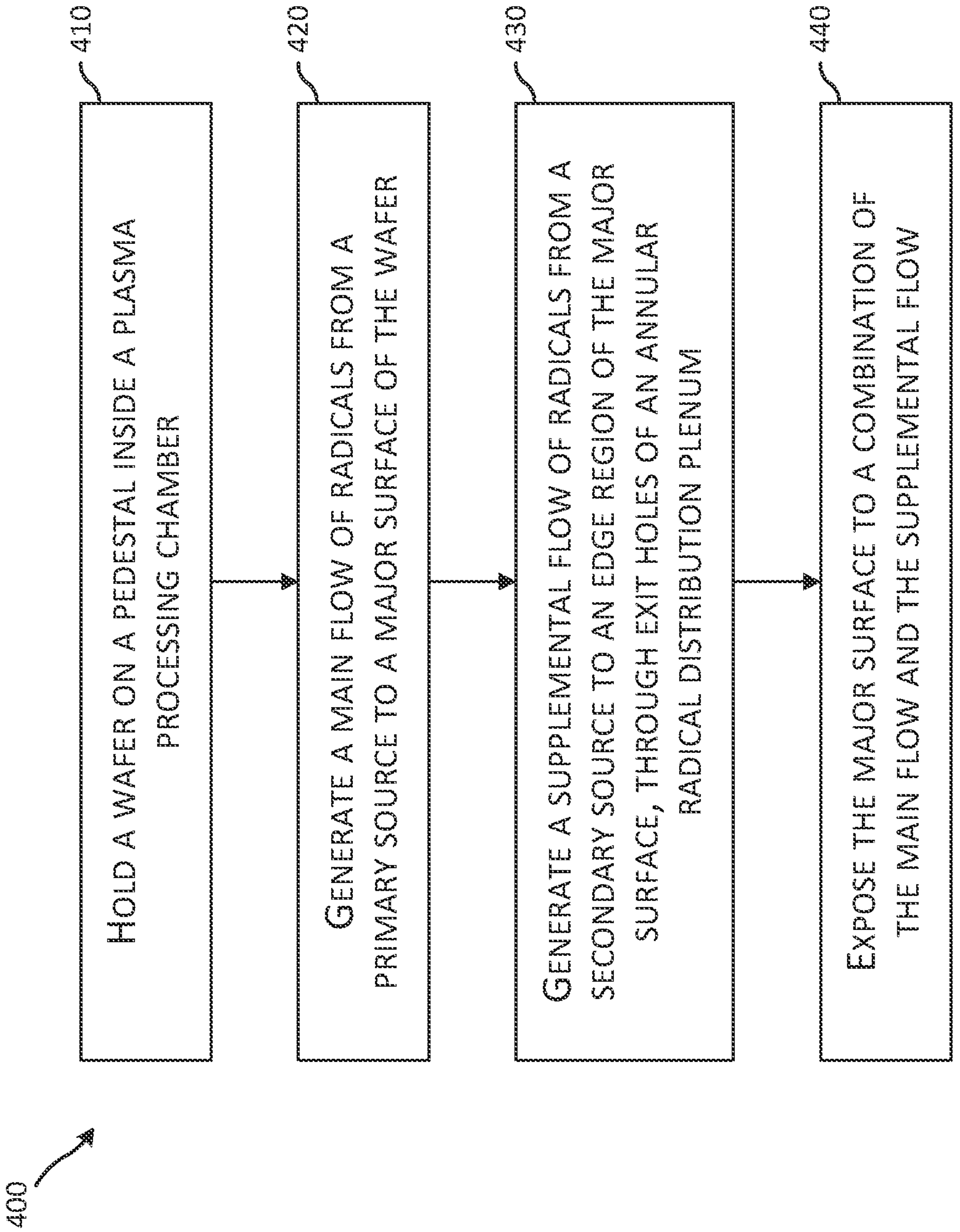
FIG. 4 illustrates a flow diagram of a plasma processing method, in accordance with some embodiment.

FIG. 3 illustrates a perspective view of an example of a gas discharge device 150 embedded in the focus ring 130. As described above with reference to FIGS. 1 and 2, each of the plurality of gas discharge devices 150 comprises a cavity 132 and an RF resonant structure. An example RF resonant structure of the embedded gas discharge device is shown. The RF resonant structure in FIG. 3 is a conductive structure comprising an example two-terminal capacitive structure 310 (having a capacitance, C) and an example two-terminal inductive structure 320 (having an inductance, L). The inset in FIG. 3 illustrates a circuit representation of the RF resonant structure and the coupling capacitance, $C_P$. As explained further below, in this embodiment, the terminals of the capacitive structure 310 and the inductive structure 320 are connected such that the RF resonant structure of each gas discharge device 150 has a parallel LC resonant circuit configuration. Furthermore, the RF resonant structures of adjacent gas discharge devices 150 are connected in parallel, thereby the plurality of RF resonant structures of the plurality of gas discharge devices 150 are electrically connected to form a combined parallel LC resonant circuit having a common top plate 314 and a common bottom plate 330.

Although the example resonant structure is a parallel LC resonant circuit, it is understood that other electrical resonators may be embedded in the focus ring 130 to couple RF power to excite a gas discharge in cavity 132. For example, the capacitive and inductive structures may be connected in a series LC resonant circuit configuration, and the RF resonant structures of adjacent gas discharge devices may be connected in series.

The example capacitive structure 310 is a parallel plate capacitor structure having a conductive top plate 314 and a conductive bottom plate 312, parallel to the top plate 314. The insulator of the focus ring 130, in which the two conductive plates (bottom plates 312 and top plate 314) are embedded, is the capacitor dielectric of the capacitive structure 310.

The inductive structure 320 comprises a continuous conductor having a top end and a bottom end. The continuous conductor provides a winding path along which electrical current may flow from one end to the other while circling around the vertical sidewall of the cavity 132, always either in a clockwise or in an anticlockwise direction, as indicated by solid white arrows in FIG. 3. The portion of the cavity 132, seen in FIG. 3, is shaped like a circular cylinder passing through the inductive structure 320. An oscillating RF current flowing through the conductive inductive structure 320 may generate electromagnetic fields that may ionize the gas in the cavity 132 to ignite plasma.

The ceiling and floor of the cylindrical cavity 132 are not visible in FIG. 3. However, as described earlier with reference to FIG. 1, the gas distribution channel 136 is coupled to the gas inlet 142 in the floor and the radical distribution plenum 134 is coupled to the radical outlet 146 in the ceiling of the cavity 132. The gas flow through the cavity 132 is indicated by vertical block arrows in FIG. 3.

A typical wire-wound inductor is shaped like a helical coil wound around a core. However, nonplanar helical coils wound around a gas discharge cavity may be difficult to integrate with planar parallel-plate capacitors to fabricate the RF resonant structures that form an electrical LC resonant circuit. In the example embodiment illustrated in FIG. 3, the focus ring 130 may be a stack of insulating layers comprising, for example, layers of alumina. A patterned conductive film comprising, for example, a metal such as platinum may be formed on a surface of each insulating layer of the insulator to form planar conductive elements. Conductive pillars formed by filling vertical through-holes with a conductive material such as platinum may be used as vias to connect conductive elements located in vertically separated layers.

As illustrated in FIG. 3, the continuous conductor for the inductive structure 320 has been formed with a vertical arrangement of a plurality of conductive segments. Each segment comprises a partial planar ring 322 around the sidewall of the cavity 132. Three partial planar rings 322 are seen in the inductive structure 320 in FIG. 3. Each partial planar ring 322 has a starting tip and an ending tip at two opposite ends of the partial ring 322. Each of these tips is connected to a first via 324 connecting the ending tip of one partial ring 322 to the starting tip of a vertically adjacent partial ring 322.

The topmost partial ring 322 of the inductive structure 320 is connected by a first via 324 to the top plate 314 of the capacitive structure 310, forming a first terminal of the RF resonant structure. The lowermost partial ring 322 is connected by another first via 324 to a bottom conductive plate 330 that is common to the plurality of RF resonant structures of the plurality of gas discharge devices 150. The bottom plate 312 of the capacitive structure 310 is also connected to the common bottom conductive plate 330 by a second via 316 (the second via 316 is taller than the first via 324). These connections, illustrated in FIG. 3, connect the terminals of the capacitive structure 310 and the inductive structure 320 of the RF resonant structure of each gas discharge device 150 in a parallel LC resonant circuit configuration.

Although not visible, the common bottom conductive plate 330, the bottom plate 312, and the top plate 314 of the conductive structure depicted in FIG. 3 extend laterally on both sides to similar adjacent cavities 132. Thus, the plurality of RF resonant structures of the plurality of gas discharge devices 150 are electrically connected to form a combined parallel LC resonant circuit.

In this embodiment, none of the conductive elements of the RF resonators have a direct connection to a conductive element outside the focus ring 130 in which the plurality of gas discharge devices 150 are embedded. This includes all the conductive elements of the capacitors 310, the inductive structures 320, and the common bottom conductive plate 330. However, directly below the common bottom conductive plate 330 there is the conductive part of the pedestal 120. Between these two conductors is a portion of the insulating focus ring 120. This is the parallel plate capacitor structure of the coupling capacitor, indicated by the capacitance, $C_P$, in the inset of FIG. 3. The RF source signal from the third RF source 240 (or the superposed signal formed by the superposition of the RF source signal and the RF bias signal from the second RF source 230) are routed to the pedestal. For the RF source signal, tuned to the high resonant frequency of the RF resonator, the capacitance $C_P$ is high enough to be approximated by a short circuit, thereby coupling RF source power to the parallel LC RF resonant structure.

On the other hand, for the low frequency RF bias signal (or a DC bias signal), $C_P$ is equivalent to a high impedance insulator. On one side of the insulator is the conductive pedestal 120 (connected to the RF bias signal) and the opposite side is the common bottom conductive plate 330 (connected to one end of the inductive structure 320). At low frequency (or DC) the inductive structure 320 is a low impedance connection to the top plate 314. The electric field in the dielectric of the capacitance $C_P$ may polarize the conductor, resulting in a respective electric field in the insulating region above the top plate 314. One advantage of having an electric field at the top of the focus ring 130 that is reflective of the bias fields applied to the pedestal is that it extends the bias fields radially beyond the edge of the wafer 110. This helps to reduce an edge discontinuity in the electric field.

In FIG. 3, the gas discharge device 150, comprising the cavity 132, the capacitive structure 310, and the inductive structure 320, is shown embedded in the insulating focus ring 130 in a particular orientation and geometry. However, it is understood that this is by example only, and that the gas discharge device (such as the gas discharge device 150) may be embedded in a variety of positions and orientations. For example, although, in FIG. 3, the capacitive structure 310 is in an upper portion of the focus ring 130, in other embodiments, the capacitive structure 310 may be positioned to be in a lower portion or in a central portion of the focus ring 130. Likewise, in another embodiment, the two conductive plates (e.g., the top and bottom plates 312 and 314) of the parallel plate capacitive structure (e.g., the capacitive structure 310) to be oriented vertically. Similarly, the inductive structure 320 and the cavity 132, which are oriented vertically in the example embodiment in FIG. 3, may be oriented horizontally in some other embodiment. Of course, in such an embodiment, the gas distribution channel 136 and the radical distribution plenum 134 would have to be in a different arrangement inside the focus ring 130. It is noted that each of these embodiments has a capacitive structure and an inductive structure which are coupled to form a resonant structure.

FIG. 4 illustrates a flow chart for a method 400 of plasma processing to achieve improved edge uniformity of a plasma process with an embodiment of a plasma processing system such as the plasma processing system 200, described above with reference to FIGS. 1-3.

The flow chart in FIG. 4 describes the invented method 400 for improving process uniformity across the center to edge of the wafer in four steps.

As indicated in block 410 of the flow chart for the method 400, a wafer is held on a pedestal inside a plasma chamber.

In block 420, the method comprises generating a main flow of radicals directed toward a major surface of the wafer. In some embodiments, a primary source providing radicals for the main flow is direct plasma. Accordingly, generating the main flow of radicals includes igniting and sustaining a gas discharge located over the pedestal. The process exposes the entire major surface of the wafer to the main flow of radicals from the discharge. In addition to the main radical flow, direct plasma exposes the major surface to a flux of ions. In other embodiments, generating the main flow may comprise directing radicals from a remote plasma source. The remote plasma source comprises a gas discharge in a chamber different from the chamber in which the wafer is being processed. The radicals generated by the remote plasma source are transported through pipes coupling the remote plasma source to a gas inlet of the chamber where the wafer is held and processed. There is a loss of radicals and ions in collisions with the walls during transport. Typically, in remote plasma processing, most of the ions are either neutralized or lose kinetic energy. As a result, the ratio of radicals to energetic ions arriving at the wafer is very high.

In addition to the main flow of radicals generated from the primary source, the method 400 includes generating a supplemental flow of radicals directed toward an edge region of the major surface, as indicated in block 430. Generating the supplemental flow of radicals comprises flowing radicals through a plurality of exit holes of an annular radical distribution plenum disposed in the chamber around an edge of the wafer. An efflux of radicals from the exit holes into the ambiance of the plasma process chamber may create a plume of supplemental radicals close to the circumferential periphery of the wafer. A portion of the supplemental radicals diffusing toward the edge region is the supplemental flow of radicals.

In order to flow radicals out through the exit holes, supplemental radicals are supplied to the radical distribution plenum from a secondary source, independent of (i.e., different from) the primary source. Hence, generating the supplemental flow of radicals includes generating a gas discharge that is a suitable secondary source of radicals. In some embodiments, the secondary radical source is a plurality of gas discharge plasmas confined in an insulating ring installed in the chamber around the edge region of the surface. For example, the insulating ring may be an insulating focus ring around the wafer embedded with a plurality of gas discharge devices. Then, generating the supplemental flow of radicals comprises igniting the plurality of gas discharges in cavities of the plurality of gas discharge devices and flowing radicals from the gas discharges into the plenum. In some embodiments, the annular plenum and the gas discharge devices may be housed in the same insulating ring.

In some other devices the secondary source may be a remote plasma source independent of the primary source. Then, generating the supplemental flow of radicals comprises generating the radicals in a remote gas discharge and transporting the radicals to a gas inlet of the chamber where the wafer is held and processed.

Example 1. An equipment for plasma processing including: a pedestal configured to hold a wafer; concentric with the pedestal, a focus ring including an insulator, the focus ring being positioned close to an edge region of the wafer when the wafer is held on the pedestal; and a plurality of gas discharge devices embedded in the focus ring, where each gas discharge device is configured to generate a gas discharge plasma confined within the focus ring.

Example 2. The equipment of example 1, further including: a plasma process chamber configured to ignite and sustain plasma in the chamber; a first radio frequency (RF) power supply coupled to an RF electrode, the RF electrode being configured to generate direct plasma over the pedestal using RF source power from the first RF power supply; and a third RF power supply coupled to the plurality of gas discharge devices, where each gas discharge device is configured to generate a gas discharge plasma using RF source power from the third RF power supply.

Example 3. The equipment of one of examples 1 or 2, further including a second RF power supply coupled to the pedestal, the pedestal being configured to provide RF bias power to the direct plasma from the second RF power supply, the second RF power supply being configured to supply RF power at a first frequency.

Example 4. The equipment of one of examples 1 to 3, where the pedestal is electrically coupled to the plurality of gas discharge devices, where the third RF power supply is coupled capacitively to the plurality of gas discharge devices by coupling the third RF power supply to the pedestal, and where the third RF power supply is configured to supply RF power at a second frequency different from the first frequency.

Example 5. The equipment of one of examples 1 to 4, where the focus ring further includes: a gas distribution channel disposed inside a lower portion of the focus ring, the channel having a gas entrance, where the entrance is configured to receive gas from a gas supply system; and a radical distribution plenum disposed inside an upper portion of the focus ring, the plenum configured to receive an influx of radicals from the plurality of gas discharge devices and deliver an efflux of radicals to the chamber through a plurality of exit holes distributed azimuthally around an edge of the wafer when the wafer is held on the pedestal.

Example 6. The equipment of one of examples 1 to 5, where each gas discharge device of the plurality of gas discharge devices includes: a cavity inside the focus ring, the cavity having a sidewall, a gas inlet coupled to the gas distribution channel, and a radical outlet coupled to the radical distribution plenum; and an RF resonant structure configured to generate a gas discharge plasma confined within the cavity, where the RF resonant structure is a conductive structure including an inductive structure and a capacitive structure.

Example 7. The equipment of one of examples 0 to 6, where the inductive structure is a two-terminal inductor (L) and the capacitive structure is a two-terminal capacitor (C), the terminals being connected in a parallel LC resonant circuit configuration.

Example 8. The equipment of one of examples 0 to 7, where the inductive structure includes a continuous conductor winding around the sidewall of the cavity, the conductor having a top end and a bottom end, and where the capacitive structure includes a conductive top plate parallel to a conductive bottom plate, the plates being embedded in the insulator of the focus ring disposed between adjacent cavities.

Example 9. The equipment of one of examples 0 to 8, where the continuous conductor of the inductive structure includes an arrangement of a plurality of conductive segments shaped as partial rings around the sidewall of the cavity connected by conductive vias, each segment having a starting tip and an ending tip at two opposite ends of the segment, and a via connecting the ending tip of the segment to the starting tip of an adjacent segment.

Example 10. A plasma processing system, the system including: a plasma process chamber; a pedestal configured to hold a wafer inside the chamber; a first radio frequency (RF) power supply coupled to a first RF electrode, the first RF electrode being configured to generate direct plasma over the pedestal using RF source power from the first RF power supply; located in the chamber, a radical distribution plenum having a plurality of exit holes arranged circularly around an edge of the wafer when the wafer is held on the pedestal, where the plenum is configured to receive a flow of radicals and distribute the flow out to the chamber through the plurality of exit holes; and a radical source coupled to the plenum, the radical source being configured to flow radicals into the plenum and, where the radical source is different from the direct plasma.

Example 11. The system of example 10, further including a second RF power supply coupled to a second RF electrode, the second RF electrode being configured to provide RF bias power to the direct plasma from the second RF power supply.

Example 12. The system of one of examples 10 or 11, where the radical source is a remote plasma source, the source being configured to generate radicals using plasma generated outside the chamber.

Example 13. The system of one of examples 10 to 12, further including: an insulating ring disposed at the edge of the wafer and separated from the pedestal, the radical distribution plenum being part of the insulating ring.

Example 14. The system of one of examples 10 to 13, further including an insulating ring disposed at the chamber wall, wherein the radical distribution plenum is being part of the insulating ring.

Example 15. The system of one of examples 10 to 14, where the system further includes an insulating ring, the ring being disposed in the chamber concentric with the pedestal, where the radical source includes a plurality of gas discharge devices embedded in the ring, each gas discharge device including a cavity and an RF resonant structure configured to generate a gas discharge plasma confined within the cavity, and where the plenum having a plurality of exit holes is a portion of the ring having a plurality of orifices.

Example 16. The system of one of examples 10 to 15, where, a gas distribution channel is disposed inside a lower portion of the ring, the channel having a gas entrance configured to receive gas from a gas supply system, and where the cavity of each gas discharge device of the plurality of gas discharge devices has a gas inlet coupled to the gas distribution channel and a radical outlet coupled to the radical distribution plenum segments adjacent to the cavity.

Example 17. The equipment of one of examples 10 to 16, where the RF resonant structure of each gas discharge device of the plurality of gas discharge devices is a two-terminal LC resonant circuit, and where the plurality of the two-terminal LC resonant circuits are electrically connected to one another form a combined two-terminal LC resonant circuit.

Example 18. The equipment of one of examples 10 to 17, further including a third RF power supply coupled to each RF resonant structure of each gas discharge device of the plurality of gas discharge devices.

Example 19. A method of plasma processing including: from a primary radical source, generating a main flow of radicals directed toward a major surface of a wafer disposed on a pedestal inside a plasma process chamber; from a secondary radical source, generating a supplemental flow of radicals directed toward an edge region of the major surface, the generating the supplemental flow of radicals including flowing radicals through a plurality of exit holes of an annular radical distribution plenum disposed in the chamber around an edge of the wafer; and exposing the major surface to a combined flow of radicals, the combined flow being a combination of the main flow and the supplemental flow.

Example 20. The method of example 19, where the secondary radical source is a plurality of gas discharge plasmas confined in an insulating ring, the ring being disposed around the edge region of the surface and, where generating the supplemental flow of radicals includes igniting respective gas discharges to form the plurality of gas discharge plasmas and flowing radicals from the gas discharge plasmas into the plenum.

Example 21. The method of one of examples 19 or 20, where the primary radical source is a remote plasma source, the source being configured to generate radicals using plasma generated outside the chamber.

While this invention has been described with reference to illustrative embodiments, this description is not intended to be construed in a limiting sense. Various modifications and combinations of the illustrative embodiments, as well as other embodiments of the invention, will be apparent to persons skilled in the aft upon reference to the description. It is therefore intended that the appended claims encompass any such modifications or embodiments.

What is claimed is:

1. An equipment for plasma processing comprising:

a chamber configured to ignite and sustain plasma in the chamber;

a pedestal configured to hold a wafer and disposed in the chamber;

concentric with the pedestal, a focus ring comprising an insulator, the focus ring being positioned close to an edge region of the wafer when the wafer is held on the pedestal;

a plurality of gas discharge devices embedded in the focus ring, wherein each gas discharge device is configured to generate a gas discharge plasma confined within the focus ring; and a radical distribution plenum disposed inside an upper portion of the focus ring, the radical distribution plenum configured to receive an influx of radicals and ions from the plurality of gas discharge devices through a plurality of radical outlets and deliver an efflux of radicals to the chamber through a plurality of exit holes, wherein each of the plurality of exit holes is spaced from a nearest neighboring one of the plurality of radical outlets by a portion of the radical distribution plenum to neutralize the ions.

2. The equipment of claim 1, further comprising:

a first radio frequency (RF) power supply coupled to an RF electrode, the RF electrode being configured to generate direct plasma over the pedestal using RF source power from the first RF power supply; and a third RF power supply coupled to the plurality of gas discharge devices, wherein each gas discharge device is configured to generate a gas discharge plasma using RF source power from the third RF power supply.

3. The equipment of claim 2, further comprising a second RF power supply coupled to the pedestal, the pedestal being configured to provide RF bias power to the direct plasma from the second RF power supply, the second RF power supply being configured to supply RF power at a first frequency.

4. The equipment of claim 3, wherein the pedestal is electrically coupled to the plurality of gas discharge devices, wherein the third RF power supply is coupled capacitively to the plurality of gas discharge devices by coupling the third RF power supply to the pedestal, and wherein the third RF power supply is configured to supply RF power at a second frequency different from the first frequency.

5. The equipment of claim 1, wherein the focus ring further comprises:

a gas distribution channel disposed inside a lower portion of the focus ring, the gas distribution channel having a gas entrance, wherein the gas entrance is configured to receive gas from a gas supply system; and wherein the plurality of exit holes is distributed azimuthally around an edge of the wafer when the wafer is held on the pedestal.

6. The equipment of claim 5, wherein each gas discharge device of the plurality of gas discharge devices comprises:

a cavity inside the focus ring, the cavity having a sidewall, a gas inlet coupled to the gas distribution channel, and one of the radical outlets coupled to the radical distribution plenum; and an RF resonant structure configured to generate a gas discharge plasma confined within the cavity, wherein the RF resonant structure is a conductive structure comprising an inductive structure and a capacitive structure.

7. The equipment of claim 6, wherein the inductive structure is a two-terminal inductor (L) and the capacitive structure is a two-terminal capacitor (C), the terminals being connected in a parallel LC resonant circuit configuration.

8. The equipment of claim 7, wherein the inductive structure comprises a continuous conductor winding around the sidewall of the cavity, the conductor having a top end and a bottom end, and wherein the capacitive structure comprises a conductive top plate parallel to a conductive bottom plate, the top and bottom plates being embedded in the insulator of the focus ring disposed between adjacent cavities.

9. The equipment of claim 8, wherein the continuous conductor of the inductive structure comprises an arrangement of a plurality of conductive segments shaped as partial rings around the sidewall of the cavity connected by conductive vias, each segment having a starting tip and an ending tip at two opposite ends of the segment, and a via connecting the ending tip of the segment to the starting tip of an adjacent segment.

10. The equipment of claim 5, wherein each gas discharge device of the plurality of gas discharge devices comprises:

a cavity inside the focus ring, the cavity having a sidewall, a gas inlet coupled to the gas distribution channel, and one of the radical outlets coupled to the radical distribution plenum; and a continuous conductor winding around the sidewall of the cavity forming an inductor; and a capacitor embedded in the focus ring and coupled to the inductor.

11. A plasma processing system, the system comprising:

a plasma process chamber;

a pedestal configured to hold a wafer inside the plasma process chamber;

a first radio frequency (RF) power supply coupled to a first RF electrode, the first RF electrode being configured to generate direct plasma over the pedestal using RF source power from the first RF power supply;

concentric with the pedestal, a focus ring comprising an insulator, the focus ring being positioned close to an edge region of the wafer when the wafer is held on the pedestal;

a plurality of gas discharge devices embedded in the focus ring, wherein each gas discharge device is configured to generate a gas discharge plasma confined within the focus ring and comprising a cavity and an RF resonant structure, the RF resonant structure configured to generate a gas discharge plasma confined within the cavity, wherein the RF resonant structure is a conductive structure comprising an inductive structure and a capacitive structure, wherein the inductive structure comprises a continuous conductor winding around a sidewall of the cavity, the conductor having a top end and a bottom end, and wherein the capacitive structure comprises a conductive top plate parallel to a conductive bottom plate, the top and bottom plates being embedded in the insulator of the focus ring; and located in the plasma process chamber, a radical distribution plenum having a plurality of exit holes arranged circularly around an edge of the wafer when the wafer is held on the pedestal, the radical distribution plenum being configured to receive an influx of radicals and ions from the plurality of gas discharge devices through a plurality of radical outlets and deliver an efflux of radicals to the plasma process chamber through a plurality of exit holes while neutralizing the ions, wherein each of the plurality of exit holes is spaced from a nearest neighboring one of the plurality of radical outlets by a portion of the radical distribution plenum to neutralize the ions.

12. The system of claim 11, further comprising a second RF power supply coupled to a second RF electrode, the second RF electrode being configured to provide RF bias power to the direct plasma from the second RF power supply.

13. The system of claim 11, further comprising an insulating ring disposed at the edge of the wafer and separated from the pedestal, the radical distribution plenum being part of the insulating ring.

14. A plasma processing system, the system comprising:

a plasma process chamber;

a pedestal configured to hold a wafer inside the plasma process chamber;

a first radio frequency (RF) electrode configured to generate direct plasma over the pedestal using a RF source power from a first RF power supply;

an insulating ring disposed in the plasma process chamber concentric with the pedestal;

a radical distribution plenum disposed in the insulating ring;

a plurality of radical sources disposed in the insulating ring, each of the plurality of radical sources comprising a cavity and an RF resonant structure configured to generate a gas discharge plasma confined within the cavity; and a combined parallel LC resonant circuit disposed in the insulating ring and comprising a plurality of parallel LC resonant circuits coupled in parallel, each cavity of each of the plurality of radical sources including one of the plurality of parallel LC resonant circuits.

15. The system of claim 14, wherein the radical distribution plenum is configured to receive a flow of radicals and distribute the flow out to the plasma process chamber through a plurality of exit holes.

16. The system of claim 14, further comprising:

a gas distribution channel disposed inside a lower portion of the insulating ring, the gas distribution channel having a gas entrance configured to receive gas from a gas supply system, and wherein the cavity of each of the plurality of radical sources has a gas inlet coupled to the gas distribution channel and a radical outlet coupled to a radical distribution plenum segment of the radical distribution plenum adjacent to the cavity.

17. The system of claim 14, wherein the combined parallel LC resonant circuit comprises a capacitor comprising a common top plate and a common bottom plate, the common top and the bottom plates disposed concentrically in the insulating ring, and wherein each of the plurality of parallel LC resonant circuits comprises an inductor comprising a plurality of partial planar rings disposed within the cavity of each of the plurality of radical sources.

18. The system of claim 14, wherein the radical distribution plenum comprises a plurality of plenum segments, wherein each of the plurality of plenum segments is coupled between two adjacent cavities of the plurality of radical sources, and wherein each of the plurality of plenum segments comprises an exit hole disposed between the two adjacent cavities.

19. The system of claim 14, further comprising a second RF power supply coupled to a second RF electrode, the second RF electrode being configured to provide RF bias power to the direct plasma from the second RF power supply.

20. The system of claim 19, further comprising a third RF power supply coupled to the combined parallel LC resonant circuit.

21. A focus ring comprising:

an insulator, the focus ring configured to be positioned close to an edge region of a wafer when the wafer is held on a pedestal within a plasma processing chamber;

a plurality of gas discharge devices embedded in the focus ring, wherein each gas discharge device is configured to generate a gas discharge plasma confined within the focus ring; and a radical distribution plenum disposed inside an upper portion of the focus ring, the radical distribution plenum configured to receive an influx of radicals and ions from the plurality of gas discharge devices through a plurality of radical outlets and deliver an efflux of radicals to the chamber through a plurality of exit holes, wherein each of the plurality of exit holes is spaced from a nearest neighboring one of the plurality of radical outlets by a portion of the radical distribution plenum to neutralize the ions.

22. The focus ring of claim 21, further comprising:

a gas distribution channel disposed inside a lower portion of the focus ring, the gas distribution channel having a gas entrance, wherein the gas entrance is configured to receive gas from a gas supply system; and wherein the plurality of exit holes is distributed azimuthally around an edge of the wafer when the wafer is held on the pedestal.

23. The focus ring of claim 22, wherein each gas discharge device of the plurality of gas discharge devices comprises:

a cavity inside the focus ring, the cavity having a sidewall, a gas inlet coupled to the gas distribution channel, and one of the radical outlets coupled to the radical distribution plenum; and an RF resonant structure configured to generate a gas discharge plasma confined within the cavity, wherein the RF resonant structure is a conductive structure comprising an inductive structure and a capacitive structure.

24. The focus ring of claim 23, wherein the inductive structure is a two-terminal inductor (L) and the capacitive structure is a two-terminal capacitor (C), the terminals being connected in a parallel LC resonant circuit configuration.

25. The focus ring of claim 24, wherein the inductive structure comprises a continuous conductor winding around the sidewall of the cavity, the conductor having a top end and a bottom end, and wherein the capacitive structure comprises a conductive top plate parallel to a conductive bottom plate, the top and bottom plates being embedded in the insulator of the focus ring disposed between adjacent cavities.

26. The focus ring of claim 25, wherein the continuous conductor of the inductive structure comprises an arrangement of a plurality of conductive segments shaped as partial rings around the sidewall of the cavity connected by conductive vias, each segment having a starting tip and an ending tip at two opposite ends of the segment, and a via connecting the ending tip of the segment to the starting tip of an adjacent segment.

27. The focus ring of claim 22, wherein each gas discharge device of the plurality of gas discharge devices comprises:

a cavity inside the focus ring, the cavity having a sidewall, a gas inlet coupled to the gas distribution channel, and one of the radical outlets coupled to the radical distribution plenum; and a continuous conductor winding around the sidewall of the cavity forming an inductor; and a capacitor embedded in the focus ring and coupled to the inductor.

28. A focus ring comprising:

an insulating ring, the insulating ring configured to be disposed in a plasma process chamber concentric with a pedestal that is configured to hold a wafer;

a radical distribution plenum disposed in the insulating ring;

a plurality of radical sources disposed in the insulating ring, each of the plurality of radical sources comprising a cavity and an RF resonant structure configured to generate a gas discharge plasma confined within the cavity; and a combined parallel LC resonant circuit disposed in the insulating ring and comprising a plurality of parallel LC resonant circuits coupled in parallel, each cavity of each of the plurality of radical sources including one of the plurality of parallel LC resonant circuits.

29. The focus ring of claim 28, wherein the radical distribution plenum is configured to receive a flow of radicals and distribute the flow out to the plasma process chamber through a plurality of exit holes.

30. The focus ring of claim 28, further comprising:

a gas distribution channel disposed inside a lower portion of the insulating ring, the gas distribution channel having a gas entrance configured to receive gas from a gas supply system, and wherein the cavity of each of the plurality of radical sources has a gas inlet coupled to the gas distribution channel and a radical outlet coupled to a radical distribution plenum segment of the radical distribution plenum adjacent to the cavity.

31. The focus ring of claim 28, wherein the combined parallel LC resonant circuit comprises a capacitor comprising a common top plate and a common bottom plate, the common top and the bottom plates disposed concentrically in the insulating ring, and wherein each of the plurality of parallel LC resonant circuits comprises an inductor comprising a plurality of partial planar rings disposed within the cavity of each of the plurality of radical sources.

32. The focus ring of claim 28, wherein the radical distribution plenum comprise a plurality of plenum segments, wherein each of the plurality of plenum segments is coupled between two adjacent cavities of the plurality of radical sources, and wherein each of the plurality of plenum segments comprises an exit hole disposed between the two adjacent cavities.

* * * * *